United States Patent
Lee et al.

(10) Patent No.: US 7,582,539 B2
(45) Date of Patent: Sep. 1, 2009

(54) METHODS OF CLEANING A SEMICONDUCTOR DEVICE AND METHODS OF MANUFACTURING A SEMICONDUCTOR DEVICE USING THE SAME

(75) Inventors: Keum-Joo Lee, Hwaseong-si (KR); Jin-Hye Bae, Suwon-si (KR); Dae-Keun Kang, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/983,513

(22) Filed: Nov. 9, 2007

(65) Prior Publication Data
US 2008/0124909 A1 May 29, 2008

(30) Foreign Application Priority Data
Nov. 10, 2006 (KR) .................. 10-2006-0110900

(51) Int. Cl.
*H01L 21/76* (2006.01)
(52) U.S. Cl. .................. 438/453; 257/E21.228
(58) Field of Classification Search .............. 438/453; 257/E21.228
See application file for complete search history.

(56) References Cited

U.S. PATENT DOCUMENTS

| | | | | |
|---|---|---|---|---|
| 5,727,578 A | * | 3/1998 | Matthews | 134/61 |
| 5,911,837 A | * | 6/1999 | Matthews | 134/2 |
| 6,503,333 B2 | * | 1/2003 | Twu et al. | 134/3 |
| 6,843,857 B2 | * | 1/2005 | Bergman | 134/28 |
| 6,864,187 B2 | * | 3/2005 | Tomimori | 438/745 |
| 6,930,014 B2 | * | 8/2005 | Kim et al. | 438/396 |
| 7,071,077 B2 | * | 7/2006 | Maleville et al. | 438/455 |
| 7,416,611 B2 | * | 8/2008 | Bergman | 134/30 |
| 2002/0062841 A1 | * | 5/2002 | Twu et al. | 134/3 |
| 2007/0042583 A1 | * | 2/2007 | Jang et al. | 438/585 |
| 2008/0124909 A1 | * | 5/2008 | Lee et al. | 438/595 |

FOREIGN PATENT DOCUMENTS

| | | |
|---|---|---|
| JP | 2000-331978 | 11/2000 |
| KR | 1020000017572 A | 3/2000 |
| KR | 1020000061342 A | 10/2000 |
| KR | 0338823 | 5/2002 |

OTHER PUBLICATIONS

Notice to Submit a Response with English language translation, KR App. No. 10-2006-0110900, Sep. 26, 2007.

* cited by examiner

*Primary Examiner*—W. David Coleman
(74) *Attorney, Agent, or Firm*—Myers Bigel Sibley & Sajovec, P.A.

(57) ABSTRACT

The present invention provides methods of cleaning a semiconductor device by removing contaminants, such as particles and/or etching by-products, from a structure of a semiconductor device using a first cleaning solution including a mixture of ammonium hydroxide ($NH_4OH$), hydrogen peroxide ($H_2O_2$) and deionized (DI) water, and a second cleaning solution including ozone ($O_3$) water. The present invention also provides methods of manufacturing a semiconductor device using these methods of cleaning the semiconductor device.

18 Claims, 5 Drawing Sheets

METHODS OF CLEANING A SEMICONDUCTOR DEVICE AND METHODS OF MANUFACTURING A SEMICONDUCTOR DEVICE USING THE SAME

CROSS-REFERENCE TO RELATED APPLICATIONS

This application claims priority under 35 USC § 119 to Korean Patent Application No. 10-2006-0110900, filed on Nov. 10, 2006, the disclosure of which is incorporated by reference herein in its entirety.

FIELD OF THE INVENTION

The present invention relates to methods of cleaning a semiconductor device and methods of manufacturing a semiconductor device using the same.

BACKGROUND OF THE INVENTION

Semiconductor technology is being improved in terms of integration degree, reliability and response speeds, as semiconductor memory devices are required to be operated at high speeds with large storage capacities. There has been some research on conductive structures of semiconductor devices having metal components. For example, tungsten silicide ($WSi_2$) has been used for metal patterns in gate electrodes or bit line electrodes of semiconductor devices to reduce the electrical resistance of the metal patterns.

Conductive structures of a semiconductor device may be formed on a substrate through various unit processes such as a deposition process, an etching process and/or a patterning process. For example, an oxide layer and a conductive layer may be formed on the substrate by the deposition process, and etched from the substrate with a mask pattern. A conductive structure such as a gate structure may then be formed on the substrate by the patterning process.

A cleaning process may be performed on the substrate with the conductive structures, so that contaminants such as particles and/or by-products generated are removed. A general cleaning process may be performed using a mixture, such as an ammonium peroxide mixture (APM) or a sulfuric peroxide mixture (SPM), as a cleaning solution. However, some of the conductive structures may react with the cleaning solution, and may thereby be damaged or consumed in the cleaning process.

For at least these reasons, a reoxidation process may be performed on the substrate with the conductive structures in order to remedy the damage to one or more sidewalls of the conductive structure and/or to the surface of the substrate caused by the chemical reaction with the cleaning solution, and to change corner portions or edge portions of the bottom of the conductive structure to be rounded and smooth. This reoxidation process allows the conductive structures to compensate for some of the portions damaged and/or consumed by the chemical reaction with the cleaning solution and expand to prevent bowing and/or protrusion defects on the conductive structures. Recently, a plasma-type reoxidation process has been used as an alternative to a conventional furnace-type reoxidation process. However, when the plasma-type reoxidation process is used, a bowing defect is formed on a sidewall of a gate electrode in a longitudinal direction as shown in FIG. 1A, because the tungsten silicide ($WSi_2$) does not adequately expand in the plasma-type reoxidation process, and thus the consumed portion of the tungsten silicide ($WSi_2$) is not adequately restored in the plasma-type reoxidation process.

When the amount of the cleaning solution is decreased in order to minimize the chemical reaction of the conductive structures with the cleaning solution, contaminants such as the particles and/or by-products are not sufficiently removed from the conductive structure and/or the substrate. When the gate electrode is formed on the substrate and contaminants still remain on the gate electrode, the residual contaminants have an adverse effect on the manufacturing yield and reliability of the semiconductor device.

Accordingly, an improved cleaning process is needed to sufficiently remove the contaminants from the conductive structure and/or the substrate that minimizes the consumption of the conductive structures and/or the substrate.

SUMMARY OF THE INVENTION

The present invention provides methods of cleaning a semiconductor device by removing contaminants, such as particles and/or etching by-products, from a structure of a semiconductor device.

Methods of removing contaminates from a structure of a semiconductor device are provided (e.g., when the structure includes a metal or metal silicide), including the step of cleaning the device with a first cleaning solution. In some embodiments the first cleaning solution includes a mixture of ammonium hydroxide ($NH_4OH$), hydrogen peroxide ($H_2O_2$) and deionized (DI) water (e.g., mixed at a volume ratio of about 1:4:20). In some embodiments the methods also include the step of cleaning the device with a second cleaning solution. In some embodiments the second cleaning solution includes ozone ($O_3$) water (e.g., at a concentration of about 10 ppm to about 100 ppm).

In some embodiments the metal silicide is tungsten silicide ($WSi_2$), titanium silicide ($TiSi_2$), tantalum silicide ($TaSi_2$), cobalt silicide ($CoSi_2$), etc.

In some embodiments, the structure includes a gate pattern having a gate insulation layer pattern and a gate conductive layer pattern.

In some embodiments, the step of cleaning with a second cleaning solution is performed at a temperature of about 0° C. to about 50° C.

In some embodiments, the second cleaning solution also includes an aqueous hydrogen fluoride (HF) solution (e.g., at a concentration of about 0.01 percent by weight to about 0.1 percent by weight).

In some embodiments, the methods further include the steps of rinsing and/or drying the structure.

In some embodiments, cleaning (e.g., cleaning with a first cleaning solution and/or cleaning with a second cleaning solution) may be performed using a dipping process, a spray process, a spin process, a drying process using isopropyl alcohol vapor, or a combination thereof.

The present invention also provides methods of manufacturing a semiconductor device using the above methods of cleaning the semiconductor device.

Methods of manufacturing a semiconductor device are provided, including one or more of the steps of: (i) forming an insulation layer and a conductive layer on a semiconductor substrate; (ii) forming a gate pattern (e.g., when the gate pattern includes a metal or metal silicide) by sequentially etching the conductive layer and the insulation layer, the gate pattern including an insulation layer pattern and a conductive layer pattern; (iii) cleaning with a first cleaning solution including a mixture of ammonium hydroxide ($NH_4OH$), hydrogen peroxide ($H_2O_2$) and deionized (DI) water; and (iv)

cleaning with a second cleaning solution including ozone ($O_3$) water (e.g., at a concentration of about 10 ppm to about 100 ppm).

In some embodiments, the metal silicide is tungsten silicide ($WSi_2$), titanium silicide ($TiSi_2$), tantalum silicide ($TaSi_2$), cobalt silicide ($CoSi_2$), etc.

In some embodiments, the step of cleaning with a second cleaning solution is performed at a temperature of about 0° C. to about 50° C.

In some embodiments, the second cleaning solution also includes an aqueous hydrogen fluoride (HF) solution (e.g., at a concentration of about 0.01 percent by weight to about 0.1 percent by weight).

In some embodiments, the methods further include the steps of rinsing and/or drying the structure.

In some embodiments, cleaning (e.g., cleaning with a first cleaning solution and/or cleaning with a second cleaning solution) may be performed using a dipping process, a spray process, a spin process, a drying process using isopropyl alcohol vapor, or a combination thereof.

In some embodiments, methods of manufacturing a semiconductor device also include the step of forming an oxide layer on the semiconductor substrate and a sidewall of the gate pattern, e.g., by reoxidizing subsequent to one of the cleaning steps (e.g., subsequent to cleaning with the second cleaning solution). In some embodiments, the reoxidation process is carried out by using plasma.

In some embodiments, methods of manufacturing a semiconductor device also include the step of forming a spacer at the sidewall of the gate pattern, e.g., subsequent to the step of forming an oxide layer.

BRIEF DESCRIPTION OF THE DRAWINGS

The above aspects and other features and advantages of the present invention will become more apparent by reference to the following detailed description when considered in conjunction with the accompanying drawings wherein.

DETAILED DESCRIPTION OF THE EMBODIMENTS

Figure 1A:
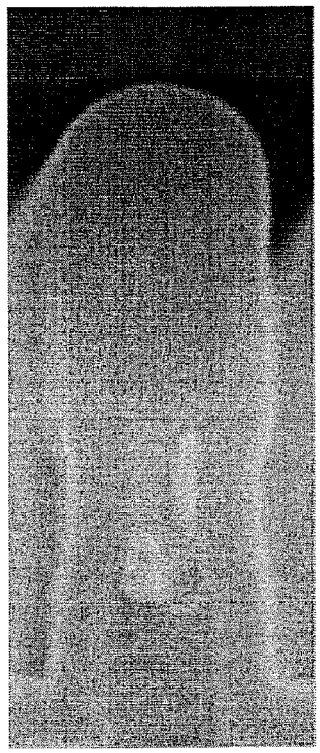
FIGS. 1A and 1B present scanning electron microscope (SEM) images showing disadvantages of cleaning a semiconductor device using a conventional method.

The present invention is described more fully hereinafter with reference to the accompanying drawings, in which embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art.

In the drawings, the sizes and relative sizes of layers and regions may be exaggerated for clarity. The drawings are not necessarily to scale. Like reference numerals designate like elements throughout the drawings.

It will also be understood that when an element or layer is referred to as being "on," "connected to" and/or "coupled to" another element or layer, the element or layer may be directly on, connected and/or coupled to the other element or layer or intervening elements or layers may be present. In contrast, when an element is referred to as being "directly on," "directly connected to" and/or "directly coupled to" another element or layer, no intervening elements or layers are present.

As used herein, the term "and/or" includes any and all combinations of one or more of the associated listed items and may be abbreviated as "/."

It will also be understood that, although the terms first, second, third etc. may be used herein to describe various elements, components, regions, layers and/or sections, these elements, components, regions, layers and/or sections should not be limited by these terms. These terms are only used to distinguish one element, component, region, layer and/or section from another region, layer and/or section. For example, a first element, component, region, layer and/or section discussed below could be termed a second element, component, region, layer and/or section without departing from the teachings of the present invention.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. For example, "a" polymer layer can mean more than one polymer layer unless a single layer is specifically noted.

It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to plan views and cross-sectional illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated as a rectangle will, typically, have rounded or curved features. Thus, the regions illustrated in the figures are schematic in nature of a device and are not intended to limit the scope of the present invention.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized and/or overly formal sense unless expressly so defined herein. Further, all publications, patent applications, patents and other references mentioned herein are incorporated by reference in their entirety.

Figure 2:
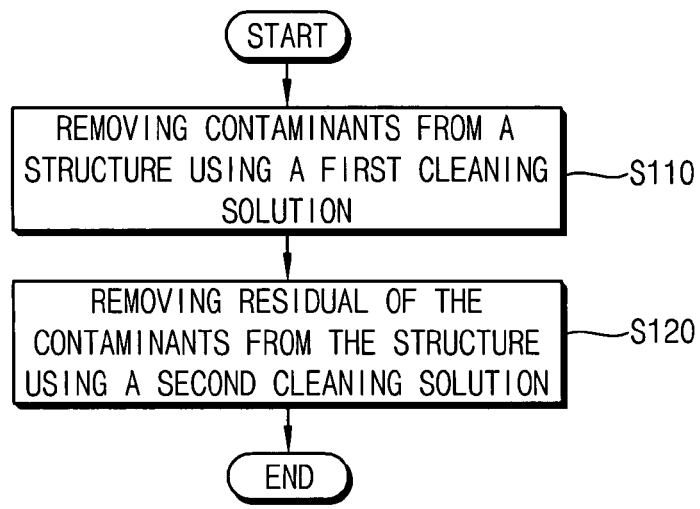
FIG. 2 presents a flow chart showing a method of cleaning a semiconductor device in accordance with some embodiments of the present invention.

FIG. 2 presents a flow chart showing a method of cleaning a semiconductor device in accordance with some embodiments of the present invention.

Referring to FIG. 2, a first cleaning process is performed on a structure formed on a substrate (step S110). The first cleaning process may be performed to remove at least some of the contaminants from the structure and the substrate using a first cleaning solution.

The structure may include a metal layer pattern formed on the substrate. For example, the metal layer pattern may include a metal silicide such as tungsten suicide ($WSi_2$). Alternatively, the metal layer pattern may include titanium silicide ($TiSi_2$), tantalum silicide ($TaSi_2$), cobalt suicide ($CoSi_2$), etc.

In some embodiments, the structure may include a gate structure. The gate structure may include a gate insulation layer pattern and a gate conductive layer pattern sequentially formed on the substrate.

In other embodiments of the present invention, the structure may include a bit line structure. The bit line structure may include a pad and a conductive layer pattern. The pad may be formed in an opening formed through an insulation layer covering the substrate. The conductive layer pattern may be located on the pad and the insulation layer. The opening of the insulation layer may expose a predetermined region of the substrate and/or a lower conductive structure formed on the substrate.

In forming the structure on the substrate according to some embodiments of the present invention, an insulation layer and a conductive layer may be sequentially formed on the substrate. The conductive layer and the insulation layer may then be partially etched to form the structure on the substrate. The structure may include an insulation layer pattern and a conductive layer pattern formed on the substrate. The insulation layer pattern and the conductive layer pattern may correspond to the gate insulation layer pattern and the gate conductive layer pattern, respectively.

In some embodiments, a first cleaning process may be performed on the substrate and the structure to remove at least some of the contaminants from the structure and the substrate after an etching process is performed to form the structure on the substrate.

In some embodiments, the first cleaning process may be performed using a first cleaning solution. The first cleaning solution may include, for example, ammonium hydroxide ($NH_4OH$), hydrogen peroxide ($H_2O_2$), deionized (DI) water, etc., and mixtures thereof. In some embodiments, the first cleaning solution may include a standard cleaning 1 (SC-1) solution in which ammonium hydroxide ($NH_4OH$), hydrogen peroxide ($H_2O_2$) and deionized (DI) water are mixed with one another at a volume ratio of about 1:4:20.

The temperature and time of which the first cleaning process is performed may be varied as appropriate. For example, in some embodiments, the first cleaning process may be performed at a temperature of about 40° C. to about 80° C. (e.g., from 40° C. to 80° C.). For example, the first cleaning process may be performed at a temperature of about 50° C. when the structure includes a conductive layer pattern with tungsten silicide ($WSi_2$) because the first cleaning solution may consume tungsten suicide ($WSi_2$) in the conductive layer pattern. In some embodiments, the first cleaning process is performed for less than about 5 minutes. When necessary due to a relatively large amount of contaminants, the first cleaning process may be performed for more about 5 minutes (e.g., more than 5 minutes) to sufficiently remove contaminants from the structure and the substrate. In other embodiments, the first cleaning process may be performed for more than about 10, 15 or 20 minutes.

In some embodiments, a rinsing process and a drying process may be performed after the first cleaning process. The rinsing process may effectively remove contaminants remaining on the structure and/or substrate after the first cleaning process. The rinsing process may be carried out using, e.g., deionized water.

In some embodiments of the present invention, the first cleaning process may include a dipping process, a spray process, a spin process, a drying process using isopropyl alcohol vapor, etc.

When the first cleaning solution includes a mixture of the ammonium hydroxide ($NH_4OH$), hydrogen peroxide ($H_2O_2$) and deionized (DI) water, in some embodiments the conductive layer pattern with tungsten silicide ($WSi_2$) may be partially consumed in the first cleaning process. That is, the conductive layer pattern with tungsten silicide ($WSi_2$) may be partially etched by chemical reaction with the first cleaning solution in the first cleaning process. When a furnace-type reoxidation process is performed on the conductive layer pattern with tungsten silicide ($WSi_2$), the furnace-type reoxidation process may allow the conductive layer pattern to compensate for the consumed portions and to expand to restore the consumed portions.

However, when a plasma-type reoxidation process is performed on the structure having the conductive layer pattern, the conductive layer pattern may not sufficiently expand to compensate for the consumed portions. Thus, the structure including the conductive layer pattern may not have the desired shape and dimensions. Therefore, the cleaning solution should ideally remove contaminates from the structure and the substrate without significant consumption of the conductive layer pattern.

In some embodiments, a second cleaning process is performed on the structure and the substrate (step S120). The second cleaning process may remove residual contaminants on the structure and the substrate after the first cleaning process. The second cleaning process may be carried out using a second cleaning solution.

In some embodiments of the present invention, the second cleaning solution may include ozone ($O_3$) water. The concentration of ozone ($O_3$) in the ozone ($O_3$) water is in a range of about 10 ppm to about 100 ppm. Alternatively, the ozone ($O_3$) water may include ozone ($O_3$) at a concentration of about 1 ppm to about 100 ppm.

In some embodiments of the present invention, the second cleaning process may be performed at a temperature of about 0° C. to about 50° C. (e.g., 0° C. to 50° C.). However, the temperature of the second cleaning process may vary in accordance with the progression of the second cleaning process and/or the type of the contaminants.

In other embodiments of the present invention, the second cleaning solution may include an aqueous hydrogen fluoride (HF) solution. For example, the concentration of hydrogen fluoride (HF) may be in a range of about 0.01 percent by weight to about 0.1 percent by weight (e.g., 0.01 percent by weight to 0.1 percent by weight). However, the concentration of the hydrogen fluoride (HF) may vary in accordance with the progression of the second cleaning process and/or the type of the contaminants.

When the second cleaning solution includes the ozone ($O_3$) water or the aqueous hydrogen fluoride (HF) solution, in some embodiments the conductive layer pattern with the metal silicide is not significantly consumed in the second cleaning process as compared to the first cleaning process using the first cleaning solution. Thus, in some embodiments contaminants may be removed from the structure and the substrate using the second cleaning solution without significant consumption of the conductive layer pattern with the metal silicide.

In some embodiments of the present invention, a rinsing process and a drying process may be performed after the second cleaning process for removing the residual contaminants.

In some embodiments of the present invention, the second cleaning process may include a dipping process, a spray process, a spin process, a drying process using isopropyl alcohol vapor, etc., similar to the first cleaning process using the first cleaning solution described above.

In some embodiments, when the first cleaning solution includes a mixture of the ammonium hydroxide ($NH_4OH$), hydrogen peroxide ($H_2O_2$) and deionized (DI) water, the contaminants may be sufficiently removed from the structure and the substrate in the first cleaning process. However, the conductive layer pattern with the metal silicide may be partially consumed and/or damaged. In some embodiments, when the second cleaning solution includes ozone ($O_3$) water, the conductive layer pattern including the metal silicide is not significantly consumed in the second cleaning process. Accordingly, in some embodiments the first cleaning process may be performed using the first cleaning solution to remove the contaminants during a first cleaning time. The first cleaning time may be varied in accordance with a desired profile of the structure and/or a consumed amount of the metal silicide. After the first cleaning process, the second cleaning process may be performed using the second cleaning solution to remove residual contaminants without consumption/damage of the conductive layer pattern with the metal silicide during a second cleaning time. The second cleaning time may be varied in accordance with the amount of the contaminants to be removed. Thus, the first cleaning time and the second cleaning time may be selectively changed and be efficiently controlled according to the desired profile of the structure, the consumed amount of the metal silicide, etc.

For example, when the consumed amount of the metal silicide is larger than desired in the first cleaning process, the first cleaning time may be reduced until the consumed amount of the metal silicide corresponds to a desired consumed amount. In addition, when the contaminants are not sufficiently removed from the structure in the second cleaning process, the second cleaning time may be increased so as to sufficiently remove the contaminants from the structure. Therefore, when the first cleaning time and the second cleaning time are efficiently controlled, the contaminants may be efficiently removed from the structure and the substrate in the first and second cleaning processes without the conductive layer pattern with the metal silicide being significantly consumed and/or damaged by the first cleaning solution and the second cleaning solution.

Figure 3:
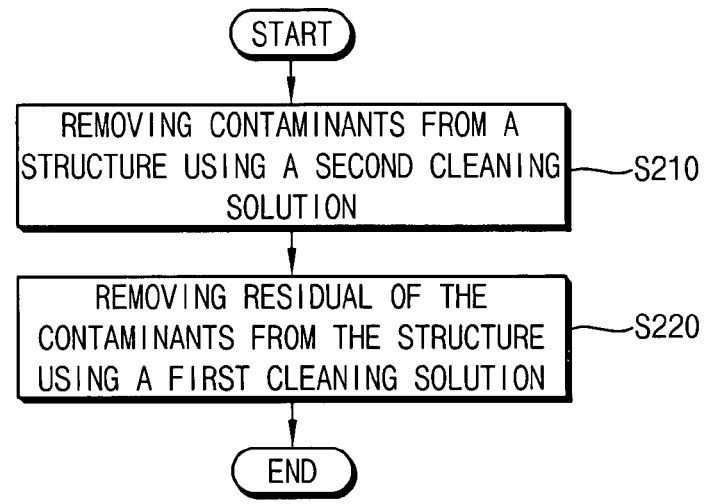
FIG. 3 presents a flow chart showing a method of cleaning a semiconductor device in accordance with other embodiments of the present invention.

FIG. 3 presents a flow chart illustrating a method of cleaning a semiconductor device in accordance with some embodiments of the present invention. For example, in some embodiments the method of cleaning the semiconductor device in FIG. 3 may be substantially the same as the method of cleaning the semiconductor device in FIG. 2 except for the order in which the cleaning solutions are used in the cleaning processes. Thus, the same reference numerals will be used to refer to the same or like parts, and further explanation will be omitted.

Referring to FIG. 3, in some embodiments a first cleaning process is performed on a structure formed on a substrate (step S210). The first cleaning process may be performed to remove the contaminants from the structure and the substrate using a second cleaning solution.

In some embodiments of the present invention, a second cleaning process may be performed on the structure and the substrate (step S220). The second cleaning process may remove the residual contaminants from the structure and the substrate after the first cleaning process. The second cleaning process may be carried out using a first cleaning solution.

In some embodiments, the first cleaning solution may include a mixture of ammonium hydroxide ($NH_4OH$), hydrogen peroxide ($H_2O_2$) and deionized (DI) water. For example, the first cleaning solution may include a standard cleaning 1 (SC-1) solution in which the ammonium hydroxide ($NH_4OH$), the hydrogen peroxide ($H_2O_2$) and the deionized (DI) water are mixed with one another at a volume ratio of about 1:4:20. In some embodiments, the first cleaning solution may be used in the second cleaning process in order to remove only residual contaminants from the structure and the substrate.

In some embodiments, when the first cleaning solution includes the SC-1 solution, the conductive layer pattern with tungsten silicide ($WSi_2$) may be consumed in the second cleaning process during the first cleaning time. That is, the conductive layer pattern with tungsten silicide ($WSi_2$) may be partially etched by the first cleaning solution when used in the second cleaning process. When a furnace-type reoxidation process is successively performed on the conductive layer pattern having tungsten suicide ($WSi_2$), the consumed portion of the conductive layer pattern may be somewhat compensated for in accordance with an expansion of the conductive layer pattern during the reoxidation process. That is, the furnace-type reoxidation process may allow the conductive layer pattern having tungsten silicide ($WSi_2$) to compensate for the consumed portions.

However, when a plasma-type reoxidation process is used in place of the conventional furnace-type reoxidation process, the plasma-type reoxidation process may not allow the conductive layer pattern to effectively expand to restore the consumed portion of the conductive layer pattern to the desired shape and dimensions.

In some embodiments of the present invention, the first cleaning process may be performed to remove contaminants from the structure and the substrate without consumption of the conductive layer pattern having the tungsten silicide ($WSi_2$) using the second cleaning solution during the second cleaning time. The second cleaning time may be varied in accordance with the amount of the contaminants to be removed. After the first cleaning process, the second cleaning process may be performed to remove residual contaminants from the structure and the substrate using the first cleaning solution during the first cleaning time. The first cleaning time may be varied in accordance with a desired profile of the structure and/or a consumed amount of the metal silicide. The first cleaning time and the second cleaning time may be selectively changed and be efficiently controlled according to the desired profile of the structure, the consumed amount of the metal silicide, etc. For example, when the consumed amount of the metal silicide is large in the first cleaning process, the first cleaning time may be reduced until the consumed amount of the metal silicide meets with a desired consumed amount. In addition, when the contaminants are not sufficiently removed from the structure in the second cleaning process, the second cleaning time may be increased so as to sufficiently remove the contaminants from the structure. Thus, the first cleaning solution may be used in the second cleaning process during a relatively short time, because the second cleaning process is performed to remove only residual contaminants. Therefore, contaminants may be completely removed without significant consumption of the tungsten silicide (WSi$_2$) by the first and second cleaning processes using the first and second cleaning solutions, respectively.

FIGS. 4 to 7 present cross-section views illustrating a method of manufacturing a semiconductor device in accordance with some embodiments of the present invention.

Figure 4:
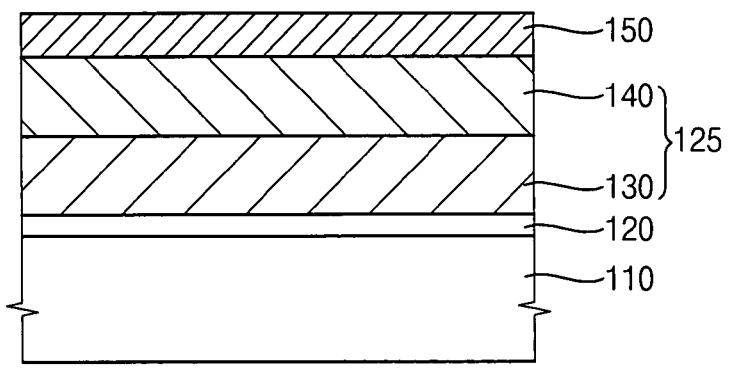
FIGS. 4 to 7 present cross-sectional views illustrating a method of manufacturing a semiconductor device in accordance with some embodiments of the present invention.

Referring to FIG. 4, an insulation layer 120 is formed on a semiconductor substrate 110 such as a silicon wafer. A conductive layer 125 is formed on the insulation layer 120.

In some embodiments, the insulation layer 120 may be formed on the substrate 110 to a thickness of about 70 Å to about 100 Å by a thermal oxidation process, a chemical vapor deposition (CVD) process, etc. The insulation layer 120 may be formed at a temperature of about 750° C. to about 900° C. to provide a surface treatment to the substrate 110.

In some embodiments, the conductive layer 125 includes a polysilicon layer 130 and a metal silicide layer 140. That is, the conductive layer 125 may have a polycide structure including the polysilicon layer 130 and the metal silicide layer 140. For example, the metal silicide layer 140 may include a tungsten silicide (WSi$_2$) layer, a cobalt silicide (CoSi$_2$) layer, a titanium suicide (TiSi$_2$) layer, a tantalum suicide (TaSi$_2$) layer, etc. In example embodiments, the metal silicide layer may include the tungsten silicide (WSi$_2$) layer.

In some embodiments a hard mask layer 150 may be formed on the conductive layer 125. The conductive layer 125 and the insulation layer 120 are partially etched using the hard mask layer 150 as an etching mask, and are formed into the conductive pattern 127 and the insulation pattern 122 in a subsequent process (see FIG. 5). In some embodiments, the hard mask layer 150 may include a single layer such as an oxide layer and a nitride layer, or a multilayer in which many single layers are stacked. In some embodiments, the hard mask layer may comprise silicon nitride, and is formed to a thickness of about 1,500 Å by a low-pressure CVD (LPCVD) process or a plasma-enhanced CVD (PECVD) process using dichlorosilane (SiH$_2$Cl$_2$) gas, silane (SiH$_4$) gas and ammonia (NH$_3$) gas as a source gas.

Figure 5:
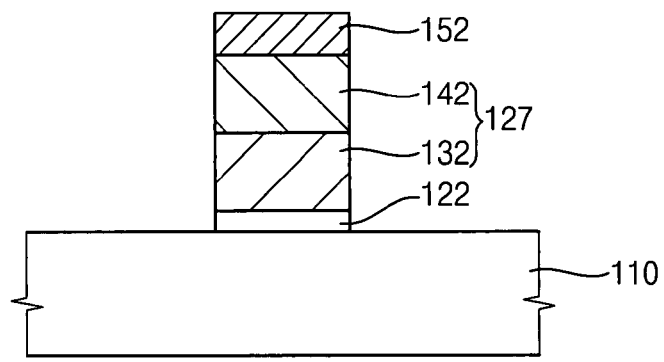

Referring to FIG. 5, in some embodiments the hard mask layer 150 is formed into a hard mask pattern 152 by, e.g., a photolithography process.

In some embodiments, the conductive layer 125 and the insulation layer 120 are sequentially etched using the hard mask pattern 152 to form the insulation layer pattern 122 and the conductive layer pattern 127 under the hard mask pattern 152.

For example, the conductive pattern 127 may include a polysilicon pattern 132 and a metal silicide pattern 142. In some embodiments, the metal silicide pattern 142 may include a tungsten silicide (WSi$_2$) pattern. For example, the insulation layer pattern 122, the polysilicon pattern 132, the metal silicide pattern 142 and the hard mask pattern 152 may be sequentially formed on the substrate 110. Accordingly, a structure including the insulation layer pattern 122, the polysilicon pattern 132 and the metal suicide pattern 142 may be formed on the substrate 110.

In some embodiments, contaminants may be formed on the structure and the substrate 110 during formation of the insulation layer pattern 122, the polysilicon pattern 132 and/or the metal silicide pattern 142 by the etching process. For example, when an etching solution remains on the structure and the substrate 110 and the etching solution is exposed to air in a transferring process for a subsequent process, the remaining etching solution may be oxidized, which may generate contaminants.

The type of the cleaning process is determined in accordance with the etching process to the conductive layer and the insulation layer. In some embodiments, when the conductive layer and the insulation layer are etched by a wet etching process, a wet cleaning process is performed with respect to the substrate 110 and the structure including the conductive pattern and the insulation pattern. In contrast, when the conductive layer and the insulation layer are etched by a dry etching process, a dry cleaning process is performed with respect to the substrate 110 and the structure.

Hereinafter, a wet cleaning process is described as an example embodiment of the cleaning process. However, the wet cleaning process is merely illustrative of the present invention and is not to be construed as limiting the invention to the described wet cleaning process, and modifications to the wet cleaning process as well as the dry cleaning process are also intended to be included within the scope of the present invention, as would be apparent to one of the ordinary skill in the art.

In some embodiments, a first cleaning process is performed on the structure and the substrate 110 using a first cleaning solution, so that contaminants may be removed from the structure and the substrate 110. In some embodiments, the first cleaning solution may include a mixture of ammonium hydroxide (NH$_4$OH), hydrogen peroxide (H$_2$O$_2$) and deionized (DI) water. In some embodiments, the first cleaning solution may include a standard cleaning 1 (SC-1) solution in which ammonium hydroxide (NH$_4$OH), hydrogen peroxide (H$_2$O$_2$) and deionized (DI) water are mixed with one another at a volume ratio of about 1:4:20.

In some embodiments, when the SC-1 solution is used as a cleaning solution for the first cleaning process, the metal suicide pattern 142 may be partially consumed in the first cleaning process, and thus the SC-1 solution may cause damage to some portions of the metal silicide pattern 142. That is, the metal silicide pattern 142 may be partially consumed by chemical reactions with the first cleaning solution in the first cleaning process. A reoxidation may be performed on the structure including the metal silicide pattern 142 and the substrate 110 so as to cure the damage to the portions of the metal silicide pattern 142. Thus, the reoxidation process allows the structure and the substrate 110 to compensate for the consumed portions and to expand to restore the consumed portions. However, when a plasma-type reoxidation process is performed as the above reoxidation process, the metal silicide pattern 142 may not be adequately expand to compensate for the consumed portions of the metal silicide pattern 142. Thus, the consumed portions of the metal silicide pattern 142 may not be adequately restored in the plasma-type reoxidation process. The structure including the metal silicide pattern 142 may thus have bowing and/or protrusion defects.

The first cleaning process may be performed during the first cleaning time. Here, the first cleaning time may be controlled so as to remove the contaminants without the consumption of metal silicide pattern 142. For example, when the first cleaning time is decreased so as to minimize the chemical reaction of the structure with the first cleaning solution, there is a possibility that contaminants are not sufficiently removed from the structure and the substrate 110. For at least this reason, a second cleaning process using a second cleaning solution may be additionally performed on the substrate 110 including the structure during the second cleaning time after the first cleaning process is performed using the first cleaning solution in the relatively short cleaning time. Accordingly, residual contaminants may be sufficiently removed from the structure and the substrate 110 to thereby more fully clean the structure and the substrate 110.

In some embodiments, the second cleaning solution may include ozone ($O_3$) water. For example, the concentration of ozone ($O_3$) in the ozone ($O_3$) water is in a range of about 10 ppm to about 100 ppm. Alternatively, the second cleaning solution may include an aqueous hydrogen fluoride (HF) solution. When the ozone ($O_3$) water or the aqueous hydrogen fluoride (HF) solution is used as the second cleaning solution for the second cleaning process, in some embodiments the metal silicide pattern 142 may not significantly react with the second cleaning solution. However, the metal silicide pattern 142 may strongly react with the first cleaning solution in the first cleaning process. Therefore, the metal silicide pattern 142 is not significantly consumed in the second cleaning process when the ozone ($O_3$) water or the aqueous hydrogen fluoride (HF) solution is used as the cleaning solution, while significantly consumed in the first cleaning process. Accordingly, the second cleaning process using the ozone ($O_3$) water or the aqueous hydrogen fluoride (HF) solution as a cleaning solution may sufficiently remove the residual contaminants from the structure and the substrate 110 without significant consumption of the metal silicide pattern 142 and significant damage to the metal silicide pattern 142. That is, the second cleaning solution may minimize the consumption and damage to the metal silicide pattern 142 in the cleaning process for removing the contaminants from the structure and the substrate 110.

Figure 6:
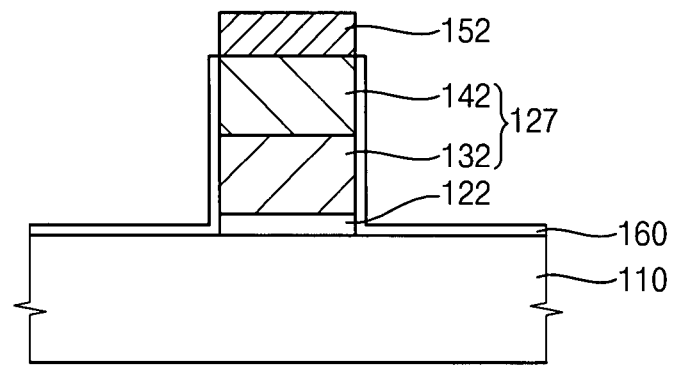

Referring to FIG. 6, a reoxidation process may be performed on the structure and the substrate 110 after the cleaning process, so that damage to a sidewall of the structure and the surface of the substrate 110 caused by the etching process and the cleaning process may be sufficiently remedied. In addition, corner portions or edge portions of a bottom of the structure may be changed into a more rounded shape.

In the reoxidation process, silicon (Si) atoms in the substrate 110 and the structure are chemically reacted with oxidants, and the surface of the substrate 110 and the sidewall of the structure are oxidized, to thereby form an oxide layer 160 on the surface of the substrate 110 and the sidewall of the structure.

In some embodiments, the reoxidation process is performed using oxygen plasma or oxygen radicals. With reference to the plasma-type reoxidation process, oxidation reactivity may be high regardless of oxidized materials, so that processing defects such as dangling bonds may be significantly reduced to thereby form a high quality oxide layer 160 on the substrate 110 and the sidewall of the structure without the processing defects. Further, the oxidation reaction in the reoxidation process is uniformly generated on the whole surface of the substrate 110 and on the whole sidewall of the structure regardless of a profile or a configuration of the structure and the substrate 110, so that the oxide layer 160 may be formed on the substrate 110 including the structure to a uniform thickness.

In some embodiments, the plasma-type reoxidation process may result in a bowing defect being formed on the sidewall of the structure, because the oxide layer 160 formed on the consumed portions of the substrate 110 and the sidewall of the structure has a thickness substantially the same as that of the oxide layer 160 formed on the unconsumed portions thereof. Thus, the structure including the metal suicide and the substrate 110 may still not have the uniform sidewall and surface, respectively. Accordingly, the second cleaning process using the second cleaning solution may be performed to reduce the consumption of the metal silicide of the structure and the surface of the substrate 110.

Therefore, in some embodiments the cleaning processes are performed using the first cleaning solution during the relatively short first cleaning time and the second cleaning solution during the second cleaning time, so that the structure including the metal silicide pattern 142 and the substrate 110 is not significantly consumed in the cleaning processes. Accordingly, the consumption of the structure and the substrate 110 may be reduced, so that the plasma-type reoxidation process may allow the structure and the substrate 110 to compensate for the consumed portions of the metal silicide pattern 142.

Figure 7:
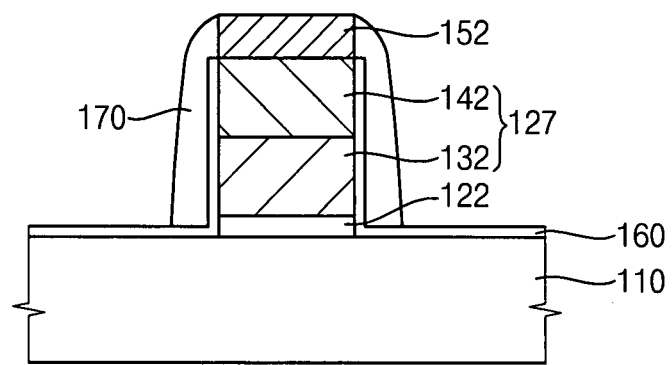

Referring to FIG. 7, a spacer 170 may be formed on the sidewall of the structure. For example, the spacer 170 may include a nitride material. The spacer 170 may be formed, for example, by a deposition process and/or by an anisotropic etching process. In some embodiments, an ion implantation process may be performed on the substrate 110 using the structure and the spacer 170 as an implantation mask.

In some embodiments, source/drain regions (not shown) may be formed under the substrate 110 adjacent to the structure. In some embodiments, when the spacer 170 is formed at the sidewall of the structure, the source/drain region may have a lightly doped drain (LDD) region.

Figure 8:
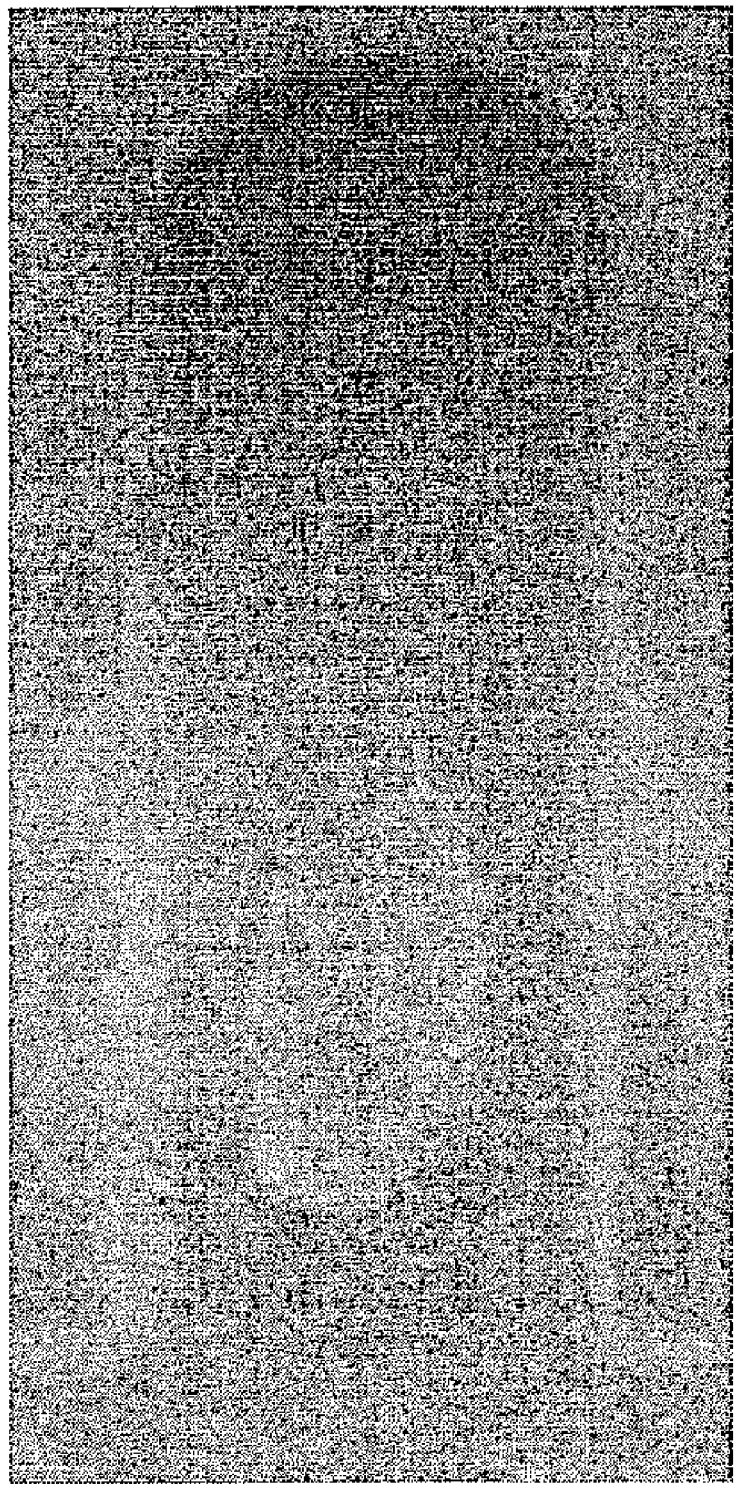
FIG. 8 presents an SEM image showing the semiconductor device cleaned using a method of cleaning the semiconductor device as described in FIG. 2 or 3.

FIG. 8 presents a scanning electron microscope (SEM) image showing the semiconductor device on which the embodiments of the cleaning process shown in FIG. 2 or 3 has been performed.

Referring to FIG. 8, when the first cleaning process using the first cleaning solution and the second cleaning process using the second cleaning solution were successively performed on the substrate including the structure, the consumption and the damage to the metal silicide pattern in the structure were significantly reduced and contaminants were sufficiently removed from the structure and the substrate in the cleaning process. Particularly, when the first cleaning process using the first cleaning solution is performed during the relatively short cleaning time, the first cleaning solution may cause insufficient removal of contaminants with minimal consumption and damage to the structure. However, when the second cleaning process using the second cleaning solution is performed during the second cleaning time after the first cleaning process, the second cleaning may cause the sufficient removal of residual contaminants without the consumption and damage to the structure and the substrate. Thus, when the plasma-type reoxidation process is performed after the cleaning processes using the first and second cleaning solutions, the plasma-type reoxidation process may allow the structure and the substrate to compensate for the consumed portions and to expand to restore the consumed portions.

The above two-stage cleaning process according to some embodiments using the first and second cleaning solutions allows a tungsten silicide ($WSi_2$) pattern to be uniformly formed on the substrate despite the use of a plasma-type reoxidation process, so that the structure and the substrate may be formed with a uniform profile when the plasma-type reoxidation process is performed on the substrate including the structure.

Figure 1B:
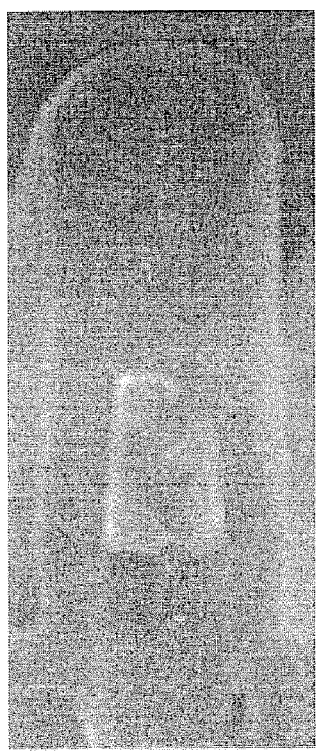

The comparison between the SEM images in FIGS. 1A and 1B and that in FIG. 8 demonstrates that processing defects, such as bowing and/or protrusion defects, were not formed on the sidewall of the structure. Therefore, the above two-stage cleaning process using the first cleaning solution and the second cleaning solution allowed the substrate including the structure to have sufficient uniformity with minimal contaminants, thereby significantly improving the profile of the structure on the substrate.

Therefore, according to the present invention, a first cleaning process may be performed using a first cleaning solution with minimal, if any, consumption and/or damage to a structure including a metal silicide pattern and a substrate during the first cleaning time, and a second cleaning process may be performed using a second cleaning solution with minimal, if any, consumption and/or damage to the structure including the metal silicide pattern and the substrate during the second cleaning time. Thus, contaminants may be sufficiently removed from the structure and the substrate with minimal consumption and/or minimal damage. Thus, when a plasma-type reoxidation process is performed on the structure and the substrate, the structure and the substrate may be cured to compensate for the consumed portions and to expand to restore the consumed portions. Further, the structure and/or the substrate may have a significantly improved profile.

While the present invention has been described with reference to specific embodiments, it will be understood by those of the art that various changes in form and details may be made without departing from the spirit and scope of the present invention as defined by the following claims.

What is claimed is:

1. A method of removing contaminates from a structure of a semiconductor device, wherein said structure comprises a metal, said method comprising:
    cleaning said device with a first cleaning solution, said first cleaning solution comprising a mixture of ammonium hydroxide ($NH_4OH$), hydrogen peroxide ($H_2O_2$) and deionized (DI) water;
    cleaning said device with a second cleaning solution, said second cleaning solution comprising ozone ($O_3$) water or hydrogen fluoride (HF); and
    forming an oxide layer on the semiconductor substrate and a sidewall of the gate pattern by reoxidizing after cleaning with the second cleaning solution, wherein the reoxidizing is carried out by using plasma,
    whereby contaminants are removed from said structure of said semiconductor device.

2. The method of claim 1, wherein said structure comprises tungsten silicide ($WSi_2$).

3. The method of claim 1, wherein said structure comprises a gate pattern, said gate pattern comprising a gate insulation layer pattern and a gate conductive layer pattern.

4. The method of claim 1, wherein said first cleaning solution comprises a mixture of ammonium hydroxide ($NH_4OH$), hydrogen peroxide ($H_2O_2$) and deionized (DI) water mixed at a volume ratio of about 1:4:20.

5. The method of claim 1, wherein the concentration of ozone ($O_3$) in the ozone ($O_3$) water is about 10 ppm to about 100 ppm.

6. The method of claim 1, wherein cleaning with a second cleaning solution is performed at a temperature in a range of about 0° C. to about 50° C.

7. The method of claim 1, wherein said second cleaning solution comprises an aqueous hydrogen fluoride (HF) solution.

8. The method of claim 1, further comprising:
    rinsing the structure; and
    drying the structure.

9. The method of claim 1, wherein cleaning with a first cleaning solution comprises a dipping process, a spray process, a spin process, a drying process using isopropyl alcohol vapor, or a combination thereof.

10. The method of claim 1, wherein cleaning with a second cleaning solution comprises: a dipping process, a spray process, a spin process, a drying process using isopropyl alcohol vapor, or a combination thereof.

11. The method of claim 7, wherein said hydrogen fluoride (HF) is provided in said second cleaning solution at a concentration of about 0.01 percent by weight to about 0.1 percent by weight.

12. A method of manufacturing a semiconductor device, comprising:
    forming an insulation layer and a conductive layer on a semiconductor substrate;
    forming a gate pattern, said gate pattern comprising a metal, by sequentially etching the conductive layer and the insulation layer, the gate pattern comprising an insulation layer pattern and a conductive layer pattern;
    cleaning said device with a first cleaning solution, said first cleaning solution comprising a mixture of ammonium hydroxide ($NH_4OH$), hydrogen peroxide ($H_2O_2$) and deionized (DI) water;
    cleaning said device with a second cleaning solution, said second cleaning solution comprising ozone ($O_3$) water or hydrogen fluoride (HF); and
    forming an oxide layer on the semiconductor substrate and a sidewall of the gate pattern by reoxidizing after cleaning with the second cleaning solution, wherein the reoxidizing is carried out by using plasma,
    to thereby manufacture said semiconductor device.

13. The method of claim 12, wherein said gate pattern comprises tungsten suicide ($WSi_2$).

14. The method of claim 12, wherein the concentration of ozone ($O_3$) in the ozone ($O_3$) water is about 10 ppm to about 100 ppm.

15. The method of claim 12, wherein cleaning with a second cleaning solution is performed at a temperature in a range of about 0° C. to about 50° C.

16. The method of claim 12, wherein said second cleaning solution comprises an aqueous hydrogen fluoride (HF) solution.

17. The method of claim 12, further comprising forming a spacer at the sidewall of the gate pattern after forming the oxide layer.

18. The method of claim 16, wherein said hydrogen fluoride (HF) is provided in said second cleaning solution at a concentration of about 0.01 percent by weight to about 0.1 percent by weight.

* * * * *